(12) United States Patent
Cheong et al.

(10) Patent No.: US 6,399,975 B1
(45) Date of Patent: Jun. 4, 2002

(54) WIDE BIT MEMORY USING POST PASSIVATION INTERCONNECTION SCHEME

(75) Inventors: Vang Cheong, Chutung; Jin-Yuen Lee; Mou-Shiung Lin, both of Hsinchu, all of (TW)

(73) Assignee: Megic Corporation, Hsinchu (TW)

( * ) Notice: Subject to any disclaimer, the term of this patent is extended or adjusted under 35 U.S.C. 154(b) by 0 days.

(21) Appl. No.: 09/801,327

(22) Filed: Mar. 7, 2001

(51) Int. Cl.$^7$ .................. H01L 27/108; H01L 29/76; H01L 29/94
(52) U.S. Cl. .................. 257/296; 257/311; 257/228
(58) Field of Search .................. 257/296, 311, 257/228

(56) References Cited

U.S. PATENT DOCUMENTS 5,391,901 A * 2/1995 Tanabe
5,406,512 A * 4/1995 Kagenishi
5,422,315 A * 6/1995 Kobayashi
6,313,491 B1 * 11/2001 Shuto

* cited by examiner

Primary Examiner—Stephen D. Meier
(74) Attorney, Agent, or Firm—J.C. Patents

(57) ABSTRACT

The present invention relates to a wide-bit memory output structure that comprises a chip having a plurality of output driver circuit cells. Each of the output driver circuit cells includes a power node, a ground node, and a signal node that are connected to respectively a first power line, a first ground line, and a first signal line. An extremity of each first power, ground, and signal line is exposed on the chip. The chip is provided with a thick metal structure thereupon, which comprises a wide power bus and a wide ground bus that are connected to respectively a plurality of second power lines and a plurality of second ground lines. Finally, the first and second power lines, first and second ground lines, and first and second signal lines are respectively connected to one another. An extremity of respectively the wide power bus, the ground bus and the second signal lines is equally exposed externally from the thick metal structure.

20 Claims, 2 Drawing Sheets

WIDE BIT MEMORY USING POST PASSIVATION INTERCONNECTION SCHEME

BACKGROUND OF THE INVENTION

1. Field of the Invention

The present invention relates to an integrated circuit thick metal structure. More particularly, the invention relates to a wide-bit memory output structure.

2. Description of the Related Art

In a context where a general trend is to reduce the size of integrated circuits, the emphasis consequently is also to miniaturize metallic interconnections internal to integrated circuit devices. However, this miniaturization produces negative effects, among which is a substantial reduction of the chip performance. More particularly, an extreme miniaturization of interconnections causes a serious voltage drop to power and ground buses, and also causes resistor-capacitor delay (RC delay) and noises issues to the critical signal path.

FIG. 1 shows a memory structure known in the art, wherein a chip 100 is provided conventionally with a plurality of output driver circuit cells 102, an output delay circuit 104, a memory clock circuit 106, a power bus 108 and a ground bus 110, a plurality of power lines 112, a plurality of ground lines 114, a plurality of signal lines 116, a plurality of control lines 118, and a clock line 120 therein. A first surface of the chip 100 is covered with a passivation layer 122, at the surface of which are exposed a power bonding pad 124, a ground bonding pad 126 and a signal bonding pad 128. Moreover, the plurality of output driver circuit cells 102 respectively has a power node 130, a ground node 132, a signal node 134 and a control node 136. The interconnection scheme of an output driver circuit cell 102 in such a structure is as follows. A power supply path is provided to the output driver circuit cell 102 through connecting to one another successively the power bonding pad 124, the power bus 108, the power line 112 and the power nodes 130 of output driver circuit cell 102. In the same manner, a connection to the ground of the output driver circuit cell 102 is provided through connecting to one another successively the ground node 132 of output driver circuit cell 102, the ground line 114, the ground bus 110, and the ground bonding pad 130. A signal path to the output driver circuit cell 102 is provided through connecting the signal bonding pad 134 of output driver circuit cell 102 through the signal line 116 to the signal bonding pad 128. The clock memory circuit 106 is connected to the output delay circuit 104 through the clock line 120, while the output delay circuit 104 in turn is connected to the control node 136 of output driver circuit cell 102 through the control line 118. The lines of the memory chip 100 is conventionally made of aluminum or aluminum alloy. Besides, the line width is extremely narrow, which results in noise and RC delay issues when a large current passes through therein. These issues cause serious negative effects to the operating of the memory chip, among which is an inefficient connection of all the output driver circuit cells 102 to both the power bus 108 and the ground bus 110, because the cross-section surface of the buses is excessively small.

Conventionally, an access to a word of stored data is performed through a plurality of output driver circuit cells 102 and, in order to increase the speed, those operations are performed preferably simultaneously. However, when the word width increases, for instance when a plurality of bytes is to be loaded simultaneously, the power bus 108 and the ground bus 110 suddenly have to supply much higher current flow, which may result in ground bounce or voltage sagging noise and may create errors. Therefore, an output delay circuit 104 is conventionally used to control the driving of a plurality of output driver circuit cells 102. In such a solution, the driving operation is typically controlled through the clock circuit 106, and the access is performed by segment, which results in a smaller number of output driver circuit cells 102 driven each time. As a result, an excessive current flow is prevented from occurring. This solution is not satisfactory from an efficiency point of view, because the circuits hence tend to be designed with more complexity, which results in an increase of silicon estate.

SUMMARY OF THE INVENTION

The present invention provides a wide-bit memory output structure, wherein a plurality of output circuit cells can be driven each time, which results in an increase of access bandwidth of the chip.

Another advantage of the wide-bit memory output structure of the present invention is that the design of the circuit can be substantially simplified.

Still, another advantage of the wide-bit memory output structure is that the noise occurrence and the RC delay are substantially reduced, which results in a better access reliability.

Still, another advantage of the wide-bit memory output structure is that the resistivity of signal lines is reduced substantially.

Still, another advantage of the wide-bit memory output structure is that the fabrication cost can be substantially reduced.

In view of at least the above, the present invention provides a wide-bit memory output structure that comprises a memory chip coupled to a thick metal structure. The memory chip comprises a plurality of output driver circuit cells, a plurality of first power lines, a plurality of first ground lines, a plurality of first signal lines, wherein each of the output driver circuit cells comprises respectively a power node, a ground node, and a signal node. The interconnection scheme of each of the output driver circuit cell is as follows. A first power line and a power node of the output driver circuit cell are connected to each other, a first ground line and a ground node of the output driver circuit cell are connected to each other, and a signal line and a signal node of the output driver circuit cell are connected to each other. An extremity of respectively first power line, first ground line, and first signal line is exposed at the surface of the memory chip. The thick metal structure comprises at least a composite dielectric material and a patterned trace structure. The patterned trace structure interlaces inside the composite dielectric material, and comprises at least a wide power bus, at least a wide ground bus, a plurality of second power lines, a plurality of second ground lines, and a plurality of second signal lines. The interconnection between the thick metal structure and an output driver circuit cell is as follows. A second power line and a first power line of the memory chip are connected to each other, a second ground line and a first ground line of the memory chip are connected to each other, a second signal line and a first signal line of the memory chip are connected to each other. Besides, the second power line and the second ground line are respectively connected to the wide power bus and the wide ground bus. An extremity of respectively, wide power bus, wide ground bus, and second signal line is exposed at the surface of the thick metal structure.

According to an embodiment of the invention, a first surface of the memory chip further comprises a first passivation layer, wherein the first passivation layer wraps the plurality of first power bonding pads, the plurality of first ground bonding pads and the plurality of first signal bonding pads. Moreover, the first surface of the thick metal structure described above also comprises a second passivation layer, wherein the second passivation layer covers at least a second power bonding pad, at least a first ground bonding pad, and a plurality of second signal bonding pads. Besides, the thick metal structure of the invention further comprises an embedded capacitor therein. The said capacitor comprises a power source metallic plate, a ground metallic plate, and a dielectric layer between the power source plate and the ground plate. The material of the said dielectric layer may be comprised of $Ta_2O_5$, and benzocyclobutene. In the thick metal structure, the material of the patterned trace may be comprised of copper, gold, nickel, aluminum or tungsten.

It is to be understood that both the foregoing general description and the following detailed description are exemplary, and are intended only to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
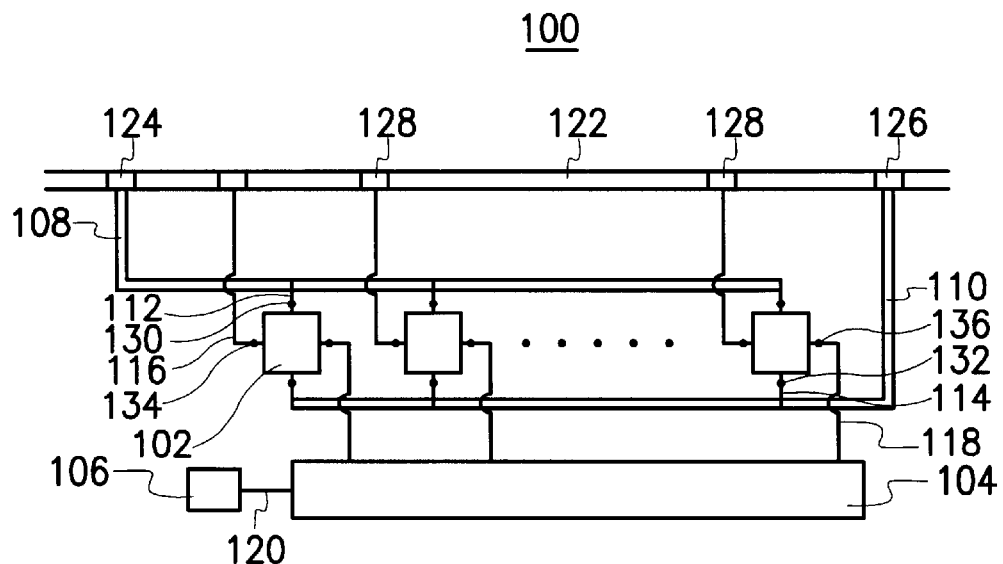
FIG. 1 shows a memory structure known in the prior art.
Figure 2:
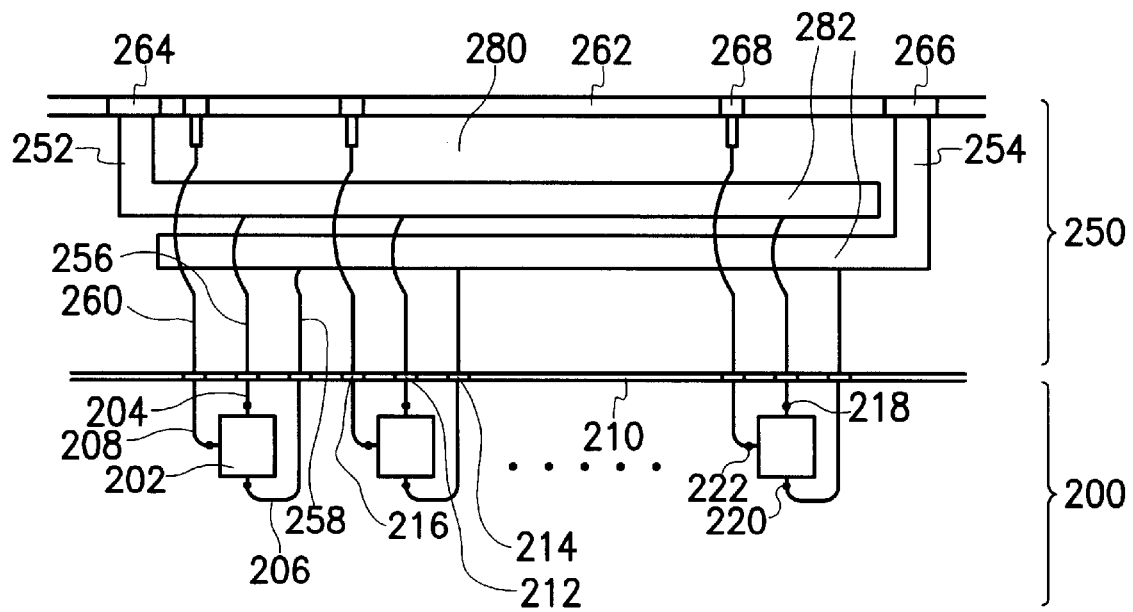
FIG. 2 shows a wide-bit memory output structure according to a first embodiment of the invention.

FIG. 2 describes a wide-bit memory output structure, according to a first embodiment of the present invention. First, a memory chip 200 is provided, the memory chip is for instance either DRAM or SRAM. The memory chip 200 includes internally a plurality of output driver circuit cells 202, a first plurality of power lines 204, a first plurality of ground lines 206, and a first plurality of signal lines 208. The memory chip 200 has a first surface that is covered by a first passivation layer 210. The first passivation layer 210 covers respectively a first plurality of power bonding pads 212, a first plurality of ground bonding pads 214, and a first plurality of signal bonding pads 216. The plurality of output driver circuit cells 202 comprises each respectively a power node 218, a ground node 220, and a signal node 222. The electrical connection of each of the output driver circuit cell is as follows: a first power bonding pad 212 connects to a first power line 204, a ground bonding pad 214 connects to a ground line 206, and a signal bonding pad 216 connects to a signal line 208. Further, the first power line 204 is connected to the power node 218, the first ground line 206 is connected to the ground node 220, and the first signal line 208 is connected to the signal nodes 222. In the present invention, it is supposed that all the semiconductor prior processes (wherein the accuracy is of tenths of micrometers), including photolithograhy, etching, CVD deposition process, sputtering, participating to the fabrication of the chip 200 have been completed.

In FIG. 2, a specific feature of the present invention is that a thick metal structure 250 (the precision is of tens of micrometers) is provided above the chip 200. In FIG. 2, a thick metal structure 250 is provided above the passivation layer 206 of the memory chip 200, The thick metal structure 250 comprises internally a composite dielectric material 280 and a patterned trace structure 282. The patterned trace structure 282 includes a wide power bus 252, a wide ground bus 254, a plurality of second power lines 256, a plurality of second ground lines 258, a plurality of second signal lines 260, a second passivation layer 262, a second power bonding pad 264, a second ground bonding pad 266, and a plurality of signal bonding pads 268. The second passivation layer 262 covers the second power bonding pad 264, the second ground bonding pad 266, and a plurality of second signal bonding pads 268. On the second passivation layer 262, a portion of respectively, the second power bonding pad 264, the second ground bonding pad 266, and the second signal bonding pads 268 is externally exposed. The composite dielectric material 280 wraps the wide power bus 252, the wide ground bus 254, the second power lines 256, the second ground lines 258, and the plurality of second signal lines 260. The interconnection between the wide-bit memory output structure and one of the output driver circuit cells 202 of the chip 200 is as follows. A second power line 256 is connected to a first power bonding pad 208, a second ground line 258 is connected to a first ground bonding pad 210, and a second signal line 260 is connected to a first signal bonding pad 212. The second power lines 256 of the thick metal structure 250 are connected to the wide power bus 252, whereas the second ground lines 258 are connected to the second wide ground bus 254. Finally, the wide power bus 252 is connected to the second power bonding pad 264, the wide ground bus 254 is connected to the second ground bonding pad 266, and the second signal lines 260 are respectively connected to the second signal bonding pads 268.

The composite dielectric material 280 can be made of polyimide HD2732 or HD2734 that are manufactured by the company Hitachi-Dupont. However, it also can be made of benzocyclobutene (also called BCB). The formation of polyimide can be performed according to a spinning-spreading-solidification method, In such a method, the polyimide, after passing through the spinning and spreading operations, is solidified in a vacuum environment or nitrogenous environment in which the temperature is between 250 and 400 celsius degrees, and the time of solidification is about one to one and half an hour. In view of obtaining a polyimide structure that is relatively thicker, a multi-layers spinning-spreading-solidification process can be performed.

The patterned trace structure 282 is arranged in the composite dielectric material 280. The patterned trace structure 282 is defined through conventional photolithography and etching processes, wherein the conductive material of the patterned trace 282 comprises copper, gold, aluminum, nickel and tungsten. Since the accuracy required for the fabrication of the thick metal structure (about several tens of micrometers) is different from that required in the semiconductor prior processes (about tenths of micrometers), hence a low cost process can be used for fabricating the thick metal structure. Such a process can be for instance electrical plating, electroless plating, or sputtering.

Therefore, in contrast with the prior art, the process for fabricating the wide-bit memory of the present invention belongs to the category of post-passivation processes, the process for fabricating the thick metal being performed only when the fabrication of the chip itself has been achieved. Because the accuracy that is required for the thick metal processing is lower, relatively lower cost equipment and lower level clean chamber thus can be used to fabricate the thick metal. As a result, the cost of the production is reduced. Besides, in the thick metal structure described above, the covering of copper lines can be performed through electrical plating, electroless plating, or sputtering, the conductivity thus can be substantially enhanced in contrast with the use of aluminum. Another advantage is that since the thick metal structure has therein a wide power bus and a wide ground bus, the resistance and the resistor-capacitor delay thereof is significantly reduced, which results in a reduction of noise. Another advantage of wide power bus and wide ground bus is that since a plurality of output driver circuit cells can be driven at each time, a delay circuit cell is therefore unnecessary, and the design of the memory clock circuit cell is thus simpler. As a result, the performance is enhanced and the circuit design is simpler, the memory chip fabrication cost hence can be substantially reduced. Finally, another advantage is that a plurality of memory integrated circuit can be connected with one another through the thick metal structure.

Figure 3:
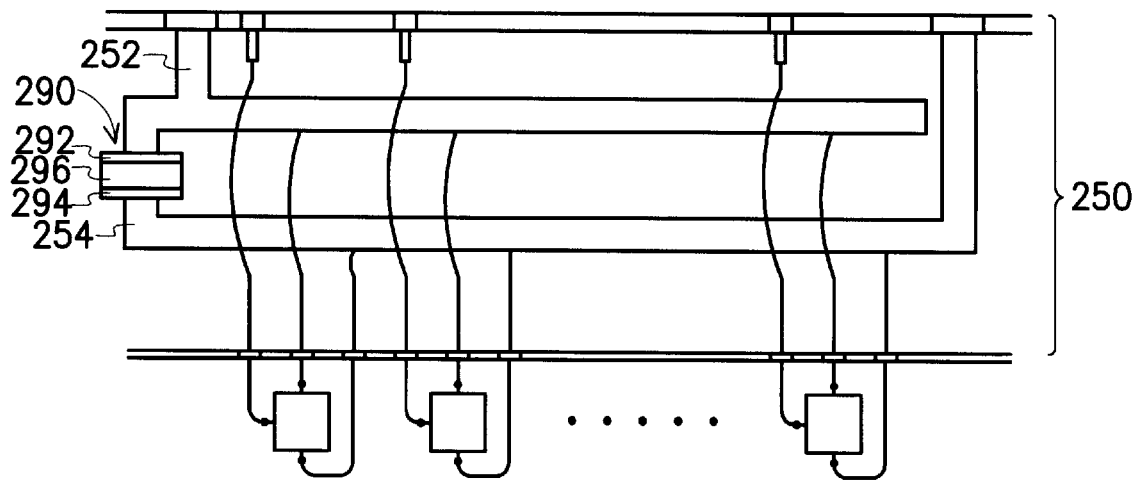
FIG. 3 shows a wide-bit memory output structure according to a second embodiment of the invention.
Figure 4:
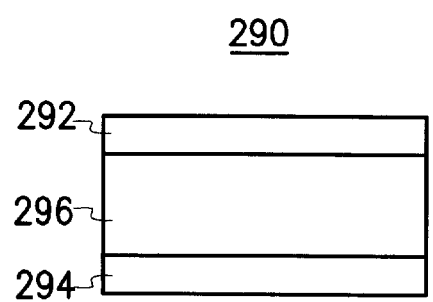
FIG. 4 shows an enlarged view of the embedded capacitor 290 of FIG. 3.

FIG. 3 describes a thick metal structure, according to a second embodiment of the present invention, while FIG. 4 shows a section view of an embedded capacitor 290 of FIG. 3. As shown in FIG. 4, the embedded capacitor 290 has a power source metallic plate 292, a ground metallic plate 294, and a dielectric layer 296, wherein the dielectric layer 296 is located between the power source metallic plate 292 and the ground metallic plate 294. The dielectric layer has to be made of material which dielectric coefficient is high, such as $Ta_2O_5$.

As shown in FIG. 3, an embedded capacitor 290 is mounted in the thick metal structure 250. The power source metallic plate 292 of the embedded capacitor 290 is connected to the wide power bus 252 whereas the ground metallic plate 294 is connected to the wide ground bus 254. In this manner, when noises and transition current occur, produced either by ground reflection or when a synchronized switch is performed during gate driving operations, the embedded capacitor then offers a short-circuit path between the power source and the ground to eliminate the noises and transition current. The embedded capacitor also allows to decrease the deterioration of the signal when it is transmitted, and reduce the influence of sudden bounce between the power source node and the ground node to the whole circuit system; sudden false signal occurrences thus can be prevented. Moreover, the embedded capacitor is designed in such a manner that it can absorb voltage drops or ground bounces at high frequency, and therefore, preventing voltage drops or ground bounces from interfering with a signal.

In conclusion, the invention includes at least the following advantages:
1. a wide-bit memory output structure that enables to drive simultaneously many output driver circuit cells, thereby improving the access bandwidth of the chip;
2. a wide-bit memory output structure that allows to simplify the design of the circuit;
3. a wide-bit memory output structure including a wide power bus and a wide ground bus, that allows to reduce the following downsides: noises, resistance thereof, resistor-capacitor delay effects, and improving the reliability of the data accessing;
4. a wide-bit memory output structure in which copper is plated on the lines that allows to increase the conductivity thereof,
5. a wide-bit memory output structure that reduces the cost of memory circuit fabrication; and
6. a wide-bit memory output structure comprising an embedded capacitor that allows reducing noises.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A wide-bit memory output structure that comprises:
a memory chip, including: a plurality of output driver circuit cells, a plurality of first power lines, a plurality of first ground lines, a plurality of first signal lines, a first passivation layer upon a first surface of the memory chip; wherein the first passivation layer covers a plurality of first power bonding pads, a plurality of first ground bonding pads, and a plurality of surrounding first signal bonding pads, such that each bonding pad has a portion of its surface exposed at the first passivation layer surface; wherein each of the output driver circuit cells includes a power node, a ground node, and a signal node that are connected to respectively one of the first power lines, one of the ground lines and one of the signal lines, wherein the first power bonding pads, the first ground bonding pads, and the first signal bonding pads are connected to respectively to the first power lines, the first ground lines, and the first signal lines; and
a thick metal structure, including: at least a composite dielectric material and a patterned trace structure; wherein the patterned trace structure interlaces internally to the composite dielectric material; wherein the patterned trace structure comprises at least a wide power bus, at least a wide ground bus, a plurality of second power lines, a plurality of second ground lines, and a plurality of second signal lines; wherein a second passivation layer covers a first surface of the thick metal structure, such that the second passivation layer wraps at least a second power bonding pad, at least a second ground bonding pad and a plurality of second signal bonding pads, such that each bonding pad has a portion of its surface externally exposed; wherein the second power lines, the ground lines, and the second signal lines are connected to respectively the first power bonding pads, the first ground bonding pads, and the first signal bonding pads; wherein the second power lines and the second ground lines are connected to respectively the wide power bus and the wide ground bus; wherein the wide power bus and the wide ground bus are connected to respectively the second power bonding pad and the second ground bonding pad; wherein the second signal lines are connected to the second signal bonding pads.

2. The wide-bit memory output structure of claim 1, wherein the wide-bit memory output structure further includes an embedded capacitor, the embedded capacitor comprising a power source metallic plate, a ground metallic plate, and a dielectric layer located between the power source metallic plate and the ground metallic plate, wherein the power source metallic plate and the ground metallic plate are connected to respectively the wide power bus and the wide ground bus.

3. The wide-bit memory output structure of claim 2, wherein the material of the dielectric layer of the embedded capacitor comprises $Ta_2O_5$.

4. The wide-bit memory output structure of claim 1, wherein the composite dielectric material comprises polyimide.

5. The wide-bit memory output structure of claim 1, wherein the composite dielectric material comprises benzocyclobutene.

6. The wide-bit memory output structure of claim 4, wherein the polyimide is formed according to a spinning-spreading-solidification method, wherein the solidification conditions are: vacuum environment or nitrogenous environment, temperature between 250° C. and 400° C., and solidification time between 0.5 to 1.5 hour.

7. The wide-bit memory output structure of claim 6, wherein a relatively thicker layer of polyimide is obtained through a multi-layer spinning-spreading-solidification method.

8. The wide-bit memory output structure of claim 1, wherein the filling of the patterned trace structure can be performed through electrical plating, electroless plating, or sputtering.

9. The wide-bit memory output structure of claim 1, wherein material of the patterned trace structure is chosen for instance among copper, gold, nickel, aluminum, tungsten.

10. A wide-bit memory output structure that comprises:
  a memory chip, including: a plurality of output driver circuit cells, a plurality of first power lines, a plurality of first ground lines, a plurality of first signal lines; wherein the plurality of output driver circuit cells comprises each respectively a first power node, a first ground node, and a first signal node that are connected to respectively one of the first power lines, one of the first ground lines and one of the first signal lines-wherein an extremity of respectively the first power lines, the first ground lines, and the first signal lines, is exposed at a first surface of the memory chip; and
  a thick metal structure, including: at least a composite dielectric material and a patterned trace structure; wherein the patterned trace structure interlaces internal to the composite dielectric material; wherein the patterned trace structure comprises at least a wide power bus, at least a wide ground bus, a plurality of second power lines, a plurality of second ground lines, and a plurality of second signal lines; wherein the second power lines, the second ground lines, and the second signal lines are connected to respectively the first power lines, the first ground lines, and the first signal lines; wherein the second power lines and the second ground lines are connected to respectively the wide power bus and the wide ground bus; wherein an extremity respectively of the wide power bus and the wide ground bus is externally exposed at a first surface of the thick metal structure.

11. The wide-bit memory output structure of claim 10, wherein the wide-bit memory output structure further includes an embedded capacitor, the embedded capacitor comprising a power source metallic plate, a ground metallic plate, and a dielectric layer located between the power source metallic plate and the ground metallic plate, wherein the power source metallic plate and the ground metallic plate are connected to respectively the wide power bus and the wide ground bus.

12. The wide-bit memory output structure of claim 11, wherein the material of the dielectric layer of the embedded capacitor comprises $Ta_2O_5$.

13. The wide-bit memory output structure of claim 10, wherein the composite dielectric material comprises polyimide.

14. The wide-bit memory output structure of claim 10, wherein the composite dielectric material comprises benzocyclobutene.

15. The wide-bit memory output structure of claim 13, wherein the polyimide is formed according to a spinning-spreading-solidification method, wherein the solidification conditions are: vacuum environment or nitrogenous environment, temperature between 250° C. and 400° C., and solidification time between 0.5 to 1.5 hour.

16. The wide-bit memory output structure of claim 15, wherein a relatively thicker layer of polyimide is obtained through a multi-layer spinning-spreading-solidification method.

17. The wide-bit memory output structure of claim 10, wherein the filling of the patterned trace structure can be performed, for instance, through electrical plating, non-electrical plating, and sputtering.

18. The wide-bit memory output structure of claim 10, wherein material of the patterned trace structure is chosen, for instance, among copper, gold, nickel, aluminum, tungsten.

19. The wide-bit memory output structure of claim 10, wherein a surface of the chip further comprises a first passivation layer that wraps a plurality of first power bonding pads, a plurality of first ground bonding pads, and a plurality of first signal bonding pads; wherein a portion of the surface of respectively first power bonding pads, ground bonding pads and first signal bonding pads is externally exposed at a surface of the first passivation layer; wherein the first power bonding pads, the first ground bonding pads, and the first signal bonding pads are connected to respectively the first power lines, the first ground lines, and the first signal lines; wherein the first power bonding pads, the first ground bonding pads, and the first signal bonding pads are also connected to respectively the second power lines, the second ground lines, and the second signal lines.

20. The wide-bit memory output structure of claim 10, wherein a surface of the thick metal structure further comprises a second passivation layer; wherein the second passivation layer wraps at least a second power bonding pad, at least a second ground bonding pad, and a plurality of second signal bonding pads; wherein a portion of a surface of respectively the second power bonding pad, the second ground bonding pad, and the second signal bonding pad is externally exposed; wherein the wide power bus, the wide ground bus and the second signal lines are connected to respectively the second power bonding pad, the second ground bonding pad, and the second signal bonding pads.

* * * * *